(12) United States Patent
Forel et al.

(10) Patent No.: US 7,053,704 B2
(45) Date of Patent: May 30, 2006

(54) AUDIO AMPLIFIER CIRCUIT WITH SUPPRESSION OF UNWANTED NOISE WHEN STARTING FROM AN OFF OR STANDBY STATE

(75) Inventors: Christophe Forel, Grenoble (FR); Robert Cittadini, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 38 days.

(21) Appl. No.: 10/816,198

(22) Filed: Apr. 1, 2004

(65) Prior Publication Data

US 2004/0212427 A1 Oct. 28, 2004

(30) Foreign Application Priority Data

Apr. 1, 2003 (FR) .................................. 03 04067

(51) Int. Cl.
*H03F 3/45* (2006.01)
(52) U.S. Cl. .......................................... 330/69; 330/51
(58) Field of Classification Search ................ 330/69, 330/51, 141, 110, 149, 86
See application file for complete search history.

(56) References Cited

U.S. PATENT DOCUMENTS

| 4,433,306 A | 2/1984 | Honda et al. |
| 5,642,074 A | 6/1997 | Ghaffaripour et al. |
| 5,648,742 A | 7/1997 | Ghaffaripour et al. |
| 5,703,529 A * | 12/1997 | Ghaffaripour et al. ........ 330/51 |
| 5,939,938 A | 8/1999 | Kalb et al. |
| 6,346,854 B1 | 2/2002 | Heithoff |
| 6,765,437 B1 * | 7/2004 | Goutti et al. ................. 330/51 |

OTHER PUBLICATIONS

French Search Report from French Patent Application 03/04067, filed Apr. 1, 2003.

* cited by examiner

*Primary Examiner*—Rexford Barnie
*Assistant Examiner*—Lam T. Mai
(74) *Attorney, Agent, or Firm*—Lisa K. Jorgenson; William R. McClellan; Wolf, Greenfield & Sacks, P.C.

(57) ABSTRACT

A power amplifier circuit including first and second cascade-assembled operational amplifiers having respective first inputs receiving a reference voltage across a decoupling capacitor, respective outputs of which are connected across a load and are looped back on respective second inputs, the second input of the first amplifier receiving, from a coupling capacitor, an input voltage to be amplified, the amplifier circuit including means for separately charging the coupling and decoupling capacitors, upon circuit power-on, from an off or standby state, and means for inhibiting the amplifiers at least during the separate charging.

29 Claims, 3 Drawing Sheets

AUDIO AMPLIFIER CIRCUIT WITH SUPPRESSION OF UNWANTED NOISE WHEN STARTING FROM AN OFF OR STANDBY STATE

BACKGROUND OF THE INVENTION

1. Field of the Invention

The present invention relates to an amplifier circuit used in audio systems.

2. Discussion of the Related Art

FIG. 1 shows a conventional audio bridge tiled load (BTL) amplifier circuit. The circuit comprises two inverter-assembled operational amplifiers 11 and 12. The inverting input (−) of amplifier 11 is connected to an input terminal E of the system by a resistor 13 and a coupling capacitor 14 connected in series. Output O1 of amplifier 11 is connected to its inverting input (−) by a resistor 15. The inverting input (−) of amplifier 12 is connected to output O1 of amplifier 11 by a resistor 16 and to its output O2 by a resistor 17. The respective outputs O1 and O2 of amplifiers 11 and 12 are connected to the terminals of a load 18, typically a loudspeaker capable of emitting sounds according to the current flowing therethrough. The non-inverting inputs (+) of amplifiers 11 and 12 are connected to a common node BP. Node BP is connected to the midpoint of a resistive divider comprising two resistors 19 and 20 connected in series between a supply terminal VCC and ground GND. A controllable switch 21, generally an MOS transistor, is interposed between supply terminal VCC and resistor 19. A standby control signal SB controls switch 21 and the power supply of amplifiers 11 and 12. In a setting to standby, signal SB causes the setting to a high-impedance state of the outputs of amplifiers 11 and 12 and the turning-off of switch 21, which results in a significant reduction in power consumption. A capacitor 22 is connected between node BP and ground, in parallel with resistor 20. Capacitor 22 has the function of filtering the noise generated by resistors 19 and 20 and of absorbing possible variations of the voltage at supply terminal VCC.

The gain of amplifier 11 is given by the ratio of resistances 15 and 13. The gain of amplifier 12 is generally chosen to be equal to −1 by setting an identical value for both resistors 16 and 17.

The expression of voltage $V_{18}$ across load 18 is then provided by the following equation:

$$V_{18} = V_{O1} - V_{O2} = -2(R_{15}/R_{13})^*(V_M - V_{BP})$$

where $R_{13}$ and $R_{15}$ are the respective values of resistors 13 and 15, and $V_{O1}$, $V_{O2}$, $V_{BP}$, and $V_M$ respectively are the voltages at outputs O1 and O2 of amplifiers 11 and 12, at node BP, and at a node M between capacitor 14 and resistor 13.

The divider formed of resistors 19 and 20 sets the voltage at node BP, and thus the charge level of capacitor 22, to a reference voltage setting a bias voltage of the audio amplifier. For example, the reference voltage may be chosen to be equal to half of supply voltage VCC, and resistances 19, 20 are then set to the same value. In normal operation, in the absence of a signal at input terminal E, the charges of capacitors 14 and 22 are equal, voltages $V_M$ and $V_{BP}$ are equal to the reference voltage, the voltage across load 18 then being zero. When a voltage is applied to input terminal E, voltage $V_M$ is equal to the reference voltage, to which adds the variable component of the input voltage, with coupling capacitor 14 suppressing the D.C. component of the input voltage.

Voltage $V_{18}$ across load 18 is equal to the variable component of the input voltage multiplied by amplification gain $-2R_{15}/R_{13}$. By choosing an appropriate ratio of resistances 15 and 13, the peak-to-peak load voltage can be significantly amplified.

FIGS. 2A to 2E are partial simplified timing diagrams illustrating the variation of voltages along time at certain points of the amplifier circuit of FIG. 1 on a powering-on of the device, that is, when the supply voltage rises from 0 volt to nominal level VCC. FIG. 2A illustrates voltage $V_{BP}$ at node BP, that is, the variation of the charge of decoupling capacitor 22. FIG. 2B illustrates voltage $V_M$ at node M, that is, the variation of the charge of coupling capacitor 14. FIG. 2C illustrates voltage $V_{O1}$ at output O1 of amplifier 11. FIG. 2D illustrates voltage $V_{O2}$ at output O2 of amplifier 12. FIG. 2E illustrates voltage $V_{18}$ across load 18. A starting time of the circuit of FIG. 1, either from a completely off state, or from a standby state, is considered as the time origin (t=0).

Upon circuit power-on, the supply voltage almost immediately switches from 0 volt to VCC. Voltage $V_{BP}$ at node BP stabilizes with the shape of a capacitor charge to the reference voltage, for example VCC/2. Voltage $V_M$ at node M also stabilizes at reference voltage VCC/2. Voltages $V_M$ and $V_{BP}$ reach their balanced level VCC/2 substantially at the same time, generally from 50 to 150 ms after power-on. However, as illustrated by a comparison of FIGS. 2A and 2B, voltage $V_M$ exhibits a delay upon power-on with respect to voltage $V_{BP}$, then reaches the balanced level at faster speed. Indeed, capacitor 14 charges faster than capacitor 22, but its charge starts with a delay, since it is performed through capacitor 22, by copying of the voltage level, through resistor 13, from node BP to node M. This charge delay translates as a difference between voltages $V_M$ and $V_{BP}$, voltage $V_M$ remaining smaller than voltage $V_{BP}$ until the balanced state is reached. Operational amplifiers 11 and 12 supplied by supply voltage VCC being almost "immediately" operative, the difference between the voltages at nodes M and BP is reflected on their respective outputs O1 and O2. Thus, as illustrated in FIG. 2C, voltage $V_{O1}$ at output O1 of amplifier 11 is very high upon power-on while voltage $V_{O2}$ at output O2 of amplifier 12 still is zero, as illustrated in FIG. 2D. This difference translates, across load 18, as a very high voltage $V_{18}$ upon power-on, often sufficient to cause a characteristic unpleasant audible noise.

To overcome this problem, various solutions have been provided. In particular, circuits comprising a relay in series with the load and switched after a delay sufficiently long for all transient variations of the amplifier circuit to have disappeared have been provided. However, such circuits are impossible to use in small-size devices such as mobile phones or walkmans due to the bulk of the relay, which is difficult to integrate.

It is also known to modify the circuit to sufficiently slow down the charges of capacitors 14 and 22 so that, at any time, the charges are substantially equal, thus reducing the difference between the voltages of nodes M and BP. The overvoltage across the load is then reduced and the corresponding residual noise is reduced to a level which is less unpleasant for the user, or even inaudible. However, this improvement is obtained at the cost of a significant lengthening of the latency time, that is the starting time during which the device is unusable, which may reach values on the order of one to two seconds. Such values are incompatible with most applications, especially telephone applications.

Further, conventional solutions impose a compromise between reduced latency times and a high capacity of the circuit for rejecting possible power supply disturbances (PSSR, power supply rejection ratio). Indeed, to minimize latency times, it would be suitable to minimize the capacitance of input coupling capacitor 14 and the resistance "seen" from the supply terminal. This would alter the capacity of the circuit for rejecting possible power supply disturbances.

SUMMARY OF THE INVENTION

The present invention aims at providing an audio amplifier circuit which overcomes the disadvantages of existing audio amplifier circuits.

The present invention also aims at providing such a circuit which makes little or no unwanted noise at the starting of the circuit from a stopped state or a standby state.

The present invention also aims at providing such a circuit that can easily be made in the form of integrated circuits.

The present invention also aims at providing such a circuit that exhibits reduced starting times.

The present invention also aims at providing such a circuit that exhibits a high capacity for rejecting possible disturbances of the power supply.

To achieve these and other objects, the present invention provides a power amplifier circuit comprising first and second cascade-assembled operational amplifiers having respective first inputs receiving a reference voltage across a decoupling capacitor, respective outputs of which are connected across a load and are looped back on respective second inputs, the second input of the first amplifier receiving, from a coupling capacitor, an input voltage to be amplified, the amplifier circuit comprising means for separately charging the coupling and decoupling capacitors, upon circuit power-on, from an off or standby state; and means for inhibiting the amplifiers at least during the separate charging.

According to an embodiment of the present invention, at the end of the separate charge, the difference between the voltage across the coupling capacitor and the voltage across the decoupling capacitor is negligible as compared to the sensitivities and offset voltages of the amplifiers, so that a subsequent balancing of the capacitor charge levels ranges between approximately 0.03 and 0.07 s, preferably on the order of 0.05 s.

According to an embodiment of the present invention, the difference between the voltage across the coupling capacitor and the voltage across the decoupling capacitor at the end of the separate charge is zero.

According to an embodiment of the present invention, the amplifiers are enabled after a predetermined time interval which follows the separate charging.

According to an embodiment of the present invention, the power amplifier circuit comprises devices capable of balancing the voltages across the capacitors at the end of the separate charging.

According to an embodiment of the present invention, the amplifiers are inhibited at least as long as the voltage across the decoupling capacitor is smaller than the reference voltage.

According to an embodiment of the present invention, the means for separately charging comprises first elements for charging, upon power-on, the coupling capacitor to a first level set by a predetermined voltage at most equal to the reference voltage; and second elements separate from the first elements for charging, upon power-on, the decoupling capacitor to a second level set by the reference voltage.

According to an embodiment of the present invention, the first and second elements are deactivated when the voltage across the decoupling capacitor reaches the reference voltage.

According to an embodiment of the present invention, the first elements comprise a controllable bias circuit having its output connected, preferably via a resistor, to a terminal of the coupling capacitor distal from a terminal receiving the input voltage, the bias circuit being connected to a supply terminal of the power amplifier circuit.

According to an embodiment of the present invention, the second elements comprise a controllable current source, connected between a high supply terminal and the first inputs of the operational amplifiers.

According to an embodiment of the present invention, the power amplifier circuit comprises a control circuit capable of providing a control signal for controlling at least the first and second elements, which switches state when the voltage across the decoupling capacitor reaches the reference voltage.

According to an embodiment of the present invention, the control signal is also provided on inhibition terminals of the amplifiers.

According to an embodiment of the present invention, a switch connects the output of the first operational amplifier to its second input, the output of a control circuit controlling the switch to the on state during the predetermined time interval from an interruption of the separate charging.

According to an embodiment of the present invention, the control circuit comprises a timing circuit setting the time interval and receiving as an input the control signal and a logic combination circuit receiving as an input the control signal and the output signal of the timing circuit, the output of the combination circuit forming the output of the control circuit.

BRIEF DESCRIPTION OF THE DRAWINGS

The foregoing objects, features, and advantages of the present invention are discussed in detail in the following non-limiting description of specific embodiments in connection with the accompanying drawings.

DETAILED DESCRIPTION

Figure 1:
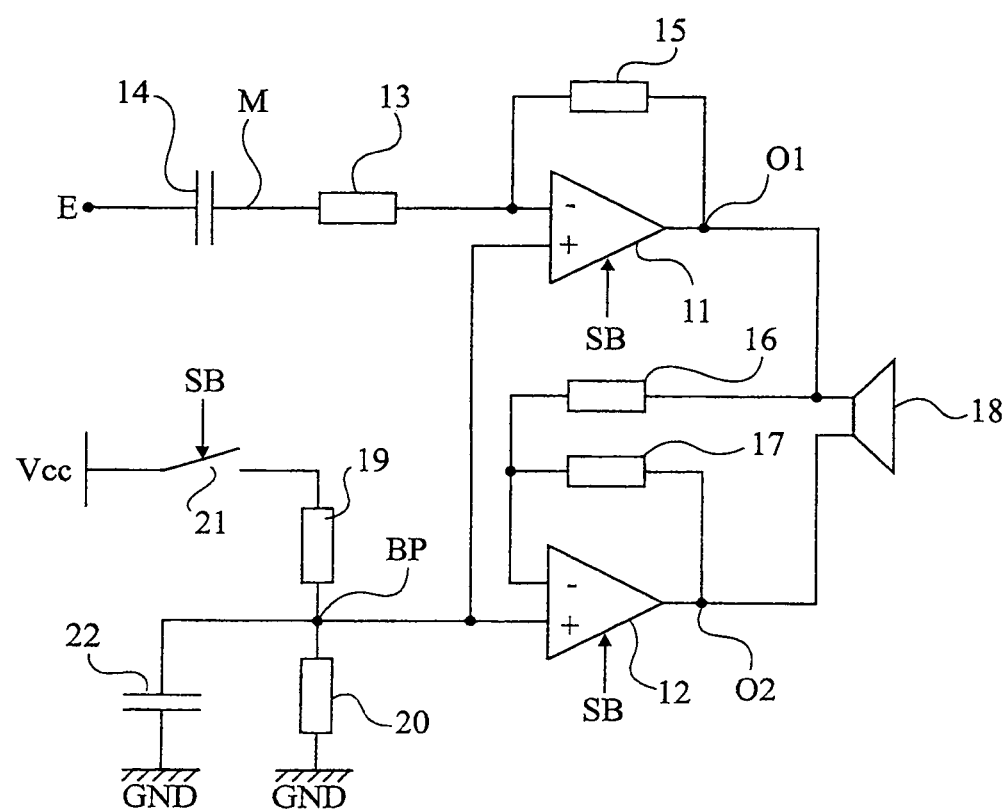
FIG. 1 schematically shows a conventional amplifier circuit architecture.
Figure 2A:
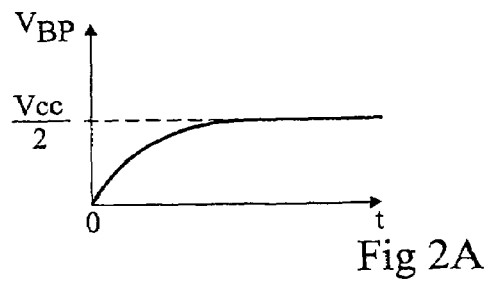
FIGS. 2A to 2E are timing diagrams illustrating signals sampled at various locations of the circuit of FIG. 1, upon powering-on thereof.
Figure 2B:
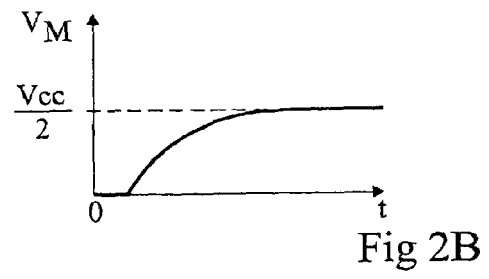
Figure 2C:
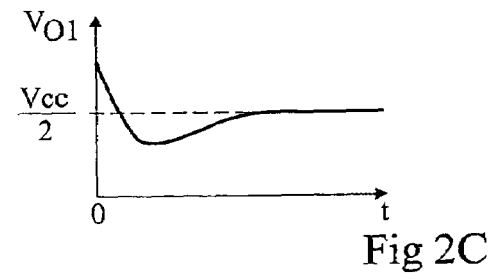
Figure 2D:
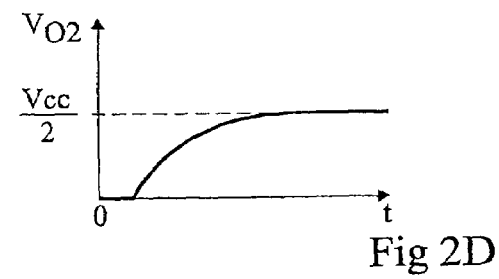
Figure 2E:
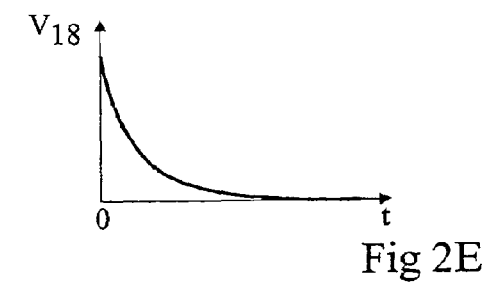

For clarity, the same reference numerals designate the same elements in the different drawings. Further, the timing diagrams of FIGS. 2A to 2E and 4A to 4E are not to scale.

A feature of the present invention is, upon starting from an off or standby state, to separately charge the coupling and decoupling capacitors of a bridge amplifier circuit while operational amplifiers of the bridge circuit are inhibited. Such a separate charge is maintained, preferably, at least as long as the charge level of the decoupling capacitor is smaller than a given reference level.

Figure 3:
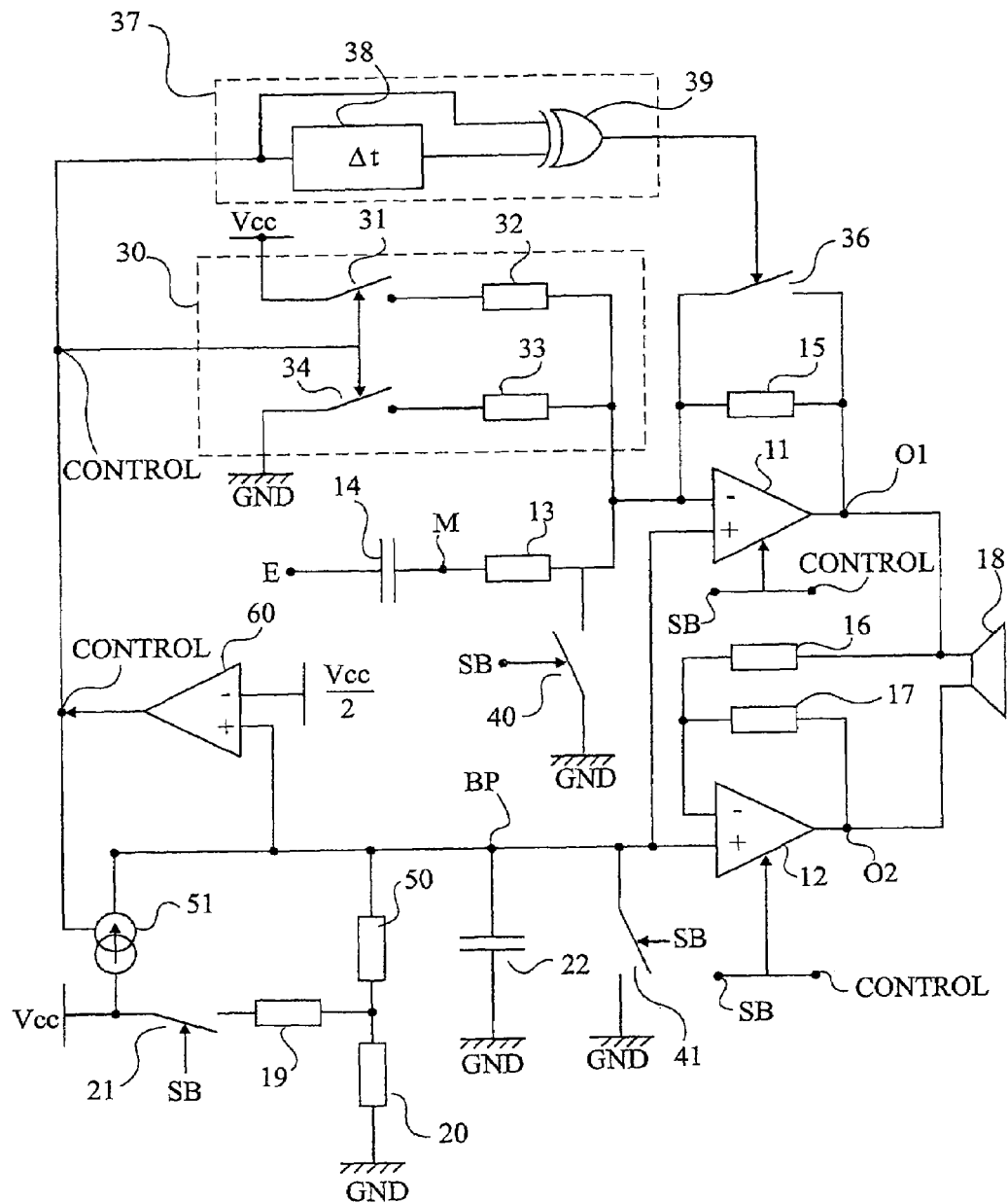
FIG. 3 shows an example of the architecture of an amplifier circuit according to the present invention.

FIG. 3 shows an example of the architecture of an amplifier circuit according to an embodiment of the present invention. The amplifier circuit comprises a bridge assembly with the same cascade structure of the two amplifiers 11 and 12 as shown in FIG. 1. For simplicity, only the differences between FIG. 1 and FIG. 3 will be described hereafter.

According to an aspect of the present invention, the amplifier circuit comprises a controllable biasing network 30 capable of charging coupling capacitor 14 to a given level, for example, half the supply voltage, VCC/2. Network 30 has the function of rapidly charging, from a power supply VCC present in the conventional circuit of FIG. 1, coupling capacitor 14 to a predetermined level separately from a charge to a reference level of decoupling capacitor 22. This predetermined level is at most equal to the reference level.

For example, biasing network 30 is formed of a series connection, between supply terminal VCC and ground GND, of a first switch 31, a first resistor 32, a second resistor 33, and a second switch 34. Switches 31 and 34 are controllable by a signal CONTROL, their off and on phases being identical. Switches 31 and 34 are, for example, MOS transistors. The junction point of the first and second resistors 32 and 33 is connected to the inverting input (−) of amplifier 11, that is, to the terminal of resistor 13 opposite to terminal M. Resistances 32 and 33 are selected so that the voltage of terminal M, reaches, at the end of the charge, the desired bias level across coupling capacitor 14.

Signal CONTROL is linked to the charge of capacitor 22 and controls the separate charging of capacitors 14 and 22 from as soon as a starting of the bridge amplifier circuit and stops the separate charging when the charge of decoupling capacitor 22 reaches the reference level.

A controllable switch 36 is connected, in parallel with resistor 15, between output O1 of amplifier 11 and its inverting input (−). Switch 36 is controlled by a control circuit 37 to be on for a time interval Δt set with respect to a time at which the voltage across decoupling capacitor 22 reaches a reference value (VCC/2). This enables prolonging by time interval Δt a state of inhibition of amplifiers 11 and 12 by forcing a zero gain state.

For example, control circuit 37 comprises a timing circuit (Δt) 38 and a logic combination circuit 39. Timing circuit 38 receives signal CONTROL as an input and delays a switching of signal CONTROL by interval Δt. Logic circuit 39 receives as an input signal CONTROL and the output signal of timing circuit 38. Logic circuit 39 provides switch 36 with a turn-on signal as soon as its two input signals are different and provides switch 36 with a turn-off signal as soon as its two input signals are equal. For example, logic circuit 39 is an XOR gate.

Signal CONTROL is also provided to respective inhibition terminals of amplifiers 11 and 12 corresponding to the terminals to which is applied standby signal SB. As will be further detailed, the state of signal CONTROL that enables turning-on of switches 31 and 34 places the outputs of amplifiers 11 and 12 to a high-impedance state. However, the complementary state of signal CONTROL which causes the turning-off of switches 31, 34 and the control of switch 36 sets amplifiers 11 and 12 in a normal operating state, in which the state of their respective output O1 and O2 depends on the state of their inputs.

On the side of amplifier 12, an additional resistor 50 is interposed between node BP and the junction point of resistors 19 and 20. Further, a controllable current source 51 is connected between supply terminal VCC and node BP. Current source 51 is controlled by control signal CONTROL.

Source 51 enables rapidly charging, to the reference level, decoupling capacitor 22 independently from the charge of coupling capacitor 14. As soon as the charge of decoupling capacitor 22 reaches the reference level, source 51 is inhibited by signal CONTROL. For this purpose, signal CONTROL is provided by a comparator 60 having its inverting reference input (−) receiving a voltage reference equal to the desired reference level (VCC/2) for capacitor 22 and having its non-inverting input (+) connected to node BP.

Figure 4A:
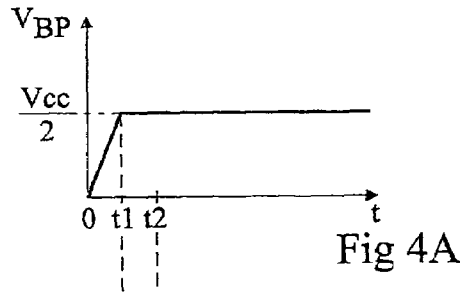
FIGS. 4A to 4E are partial simplified timing diagrams illustrating the variation of voltages along time at certain points of the amplifier circuit of FIG. 3, upon powering-on thereof.
Figure 4B:
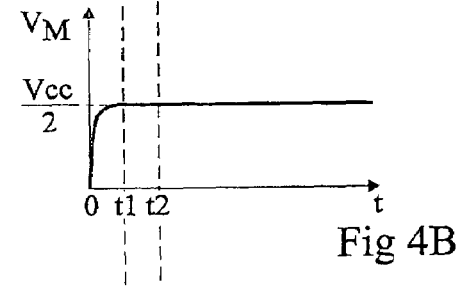
Figure 4C:
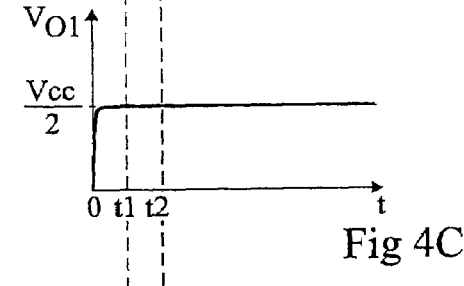
Figure 4D:
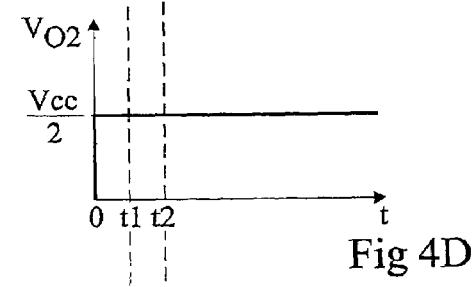
Figure 4E:
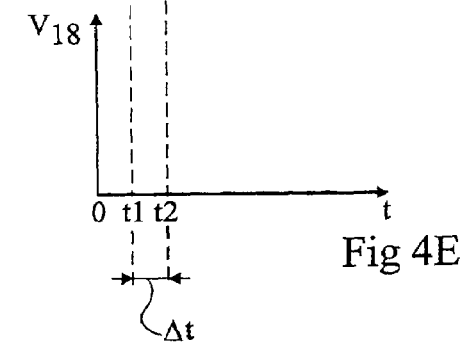

FIGS. 4A to 4E partially and schematically illustrate the variation of voltages along time at certain points of the amplifier circuit of FIG. 3, upon powering-on, that is, when the supply voltage switches from 0 volt to nominal level VCC. FIG. 4A illustrates voltage $V_{BP}$ at node BP, that is, the variation of the charge of decoupling capacitor 22. FIG. 4B illustrates voltage $V_M$ at node M, that is, the variation of the charge of coupling capacitor 14. FIG. 4C illustrates voltage $V_{O1}$ at output O1 of amplifier 11. FIG. 4D illustrates voltage $V_{O2}$ at output O2 of amplifier 12. FIG. 4E illustrates voltage $V_{18}$ across load 18. A power-on time of the circuit of FIG. 3, either from a completely off state, or from a standby state, is considered as the time origin (t=0).

At the circuit power-on, standby signal SB switches state, turning on switch 21. Capacitors 14 and 22 being discharged, voltages $V_M$ and $V_{BP}$ are zero. The state of output signal CONTROL of comparator 60 is then such that switches 31 and 34 turn on and current source 51 starts. The state of control signal CONTROL is such that amplifiers 11 and 12 are in high-impedance state.

As illustrated in FIG. 4A, current source 51 then linearly charges capacitor 22. Source 51 is sized so that voltage $V_{BP}$ across capacitor 22 very rapidly reaches the desired reference level (VCC/2). "Very rapidly" means a charge time ranging between approximately 0.03 and 0.07 s, preferably on the order of 0.05 s. The time at which node BP reaches the reference voltage is called t1.

As illustrated in FIG. 4B, from time t0, capacitor 14 very rapidly charges, exponentially, through resistive divider 32, 33 of network 30. The charge time of coupling capacitor 14 is at most equal to charge time t1 of decoupling capacitor 22. At time t1, voltage $V_M$ across capacitor 14 is then equal to the bias level set by network 30. This level is chosen to be close to the reference voltage of decoupling capacitor 22. "Close" means that the difference between the bias level of capacitor 14 and reference voltage VCC/2 is negligible with respect to the sensitivities and offset voltages of amplifiers 11 and 12. Preferably, the bias level set by network 30 is equal to reference voltage VCC/2.

At time t1, since voltage $V_{BP}$ at node BP reaches reference level VCC/2, comparator 60 causes a state switching of signal CONTROL. Signal CONTROL then inhibits current source 51, turns off switches 31 and 34 and activates amplifiers 11 and 12.

The state switching of signal CONTROL is also provided to the input of control circuit 37 of switch 36. Timing circuit 38 transmits this state switching of signal CONTROL with a delay Δt, at a time t2 (t2=t1+Δt). The gain of amplifier 11 is then zero until time t2.

Between times t1 and t2, the charge of capacitor 22 is maintained by power supply VCC through resistive bridge 19, 20, 50. The charge of capacitor 14 is also maintained by the copying at node M of voltage $V_{BP}$. Since amplifier 11 exhibits a zero gain, voltages $V_{BP}$ and $V_M$ balance at reference level VCC/2 (FIGS. 4A and 4B) set by resistive bridge 19, 20, and 50. Each of capacitors 14 and 22 having been previously charged to a value close to the desired value, the difference between voltages $V_M$ and $V_{BP}$ is very small.

Outputs O1 and O2 of amplifiers 11 and 12 remain stable and equal (FIGS. 4C and 4D) at VCC/2. As illustrated in FIG. 4E, voltage $V_{18}$ applied to load 18 remains zero.

From time t2, switch 36 is off and amplifier 11 exhibits a non-zero gain, defined by the values of resistors 13 and 15. The operation conforms to a normal operation, any input signal applied on input E being amplified across load 18. In the absence of an input signal, as illustrated in FIGS. 4A to 4E, the system remains stable at the state that it would exhibit at time t2.

The duration of the intermediary phase, that is, the value of timing Δt of circuit 37, is chosen to guarantee the balancing of voltages $V_M$ and $V_{BP}$. Since these voltages are already close to each other, a very short duration is sufficient. Preferably, timing Δt is chosen so that the total latency time of the circuit, from t=0 to time t2, is at most 0.1 s. In the considered example, timing Δt ranges between approximately 0.03 and 0.07 s, preferably on the order of 0.05 s.

Upon setting to standby or turning-off of the circuit, the signal for setting to standby SB switches state, amplifiers 11 and 12 are placed in a high impedance state, and switch 21 is off. Preferably, standby control signal SB also enables controlling a turning-off of switches 31, 34, and 36 and inhibiting source 51.

Preferably, as illustrated in FIG. 3, the inverting input (−) of amplifier 11 and terminal BP are grounded by controllable switches 40 and 41, respectively. Switches 40 and 41 are of the same type and are controlled to be turned off and to be turned on by standby control signal SB. Upon setting to standby or turning-off, switches 40 and 41 turn on and capacitors 14 and 22 discharge very rapidly. At a new starting, the previously-described operation is repeated.

The present invention enables suppressing the unwanted noise of prior circuits. The fast separate charge of capacitors 14 and 22 ensures, upon enabling of the amplifiers, that the charge levels of capacitors 14 and 22 are already stabilized at a same bias level.

Further, the circuit according to an embodiment of the present invention is particularly simple as compared to existing solutions and is integrable.

Moreover, the above advantages are obtained without increasing the latency time of the amplifier circuit. As indicated previously, the latency time at the starting is at most 0.1 s. This is shorter than the known solutions, particularly shorter than the power amplifier described in U.S. Pat. No. 4,433,306 comprising a complex circuit made of voltage followers and whose latency time is more than 0.1 s, about 0.15 s.

Further, the above advantages are obtained with a circuit which has a higher capacity for rejecting possible power supply disturbances (PSSR) than known circuits. Indeed, according to the present invention, the common non-inverting (+) reference input BP of amplifiers 11 and 12 is protected by a series resistor 50. Resistor 50 may have a very high value, on the order of from one to two megaohms, for example, 1.8 MΩ, which enhances the circuit immunity to noise of power supply VCC. Further, since the prior charge of decoupling capacitor 22 is ensured by source 51, it is possible to modify the value of capacitor 22 to increase this immunity.

Of course, the present invention is likely to have various alterations, modifications, and improvements which will readily occur to those skilled in the art. In particular, the case of a bridge-assembled amplifier connected across a load formed by an audio circuit such as a loudspeaker has been considered in the foregoing description. However, the present invention also applies to two bridge amplifiers, whatever the type of the load connected to its outputs.

Further, those skilled in the art will be able to choose elements capable of implementing the desired operation. For example, comparator 60 and operational amplifiers 11, 12 may be replaced with any element performing the same function. Similarly, those skilled in the art will be able to appropriately choose and control switches 31, 34, 36, 40, and 41.

Moreover, current source 51 is a variable source capable of enabling fast charge to the desired reference level, whatever the value of supply voltage VCC, generally ranging between 1.8 and 5.5 volts. In single-supply applications, in which the value of the supply voltage is perfectly well known, current source 51 is optimized according to a compromise between the desired time limit and an integration surface area which is as small as possible.

Those skilled in the art should also understand that the previously-indicated charge time and/or latency time and/or timing numerical values especially depend on the capacitances of coupling capacitor 14 and decoupling capacitor 22. In particular, the charge time, for a given source 51, depends on the capacitance of decoupling capacitor 22, for example on the order of 1 μF. A value of delay Δt of at most 0.05 s is sufficient in most applications. However, more generally, this value can be increased if need be and is preferably chosen to be equal to three times the time constant set by coupling capacitor 14 and resistor 13. The choice of timing value Δt also depends on integration constraints of timing circuit 38.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power amplifier circuit comprising:
   first and second cascade-assembled operational amplifiers having respective first inputs receiving a reference voltage across a decoupling capacitor, respective outputs of which are connected across a load and are looped back on respective second inputs, the second input of the first amplifier receiving, from a coupling capacitor, an input voltage to be amplified,
   first elements for charging, upon power-on, the coupling capacitor to a first level set by a predetermined voltage at most equal to the reference voltage; and
   second elements separate from the first elements for charging, upon power-on, the decoupling capacitor to a second level set by said reference voltage,
   wherein the first elements comprise a controllable resistive bridge.

2. The circuit of claim 1, wherein at an end of the separate charging, a difference between a voltage across the coupling capacitor and a voltage across the decoupling capacitor is negligible as compared to the sensitivities and offset voltages of the amplifiers, so that a subsequent balancing of capacitor charge levels ranges between approximately 0.03 and 0.07 s.

3. The circuit of claim 2, wherein the difference between the voltage across the coupling capacitor and the voltage across the decoupling capacitor at the end of the separate charging is zero.

4. The circuit of claim 2, wherein said amplifiers are enabled after a predetermined time interval which follows the separate charging.

5. The circuit of claim 2, comprising devices capable of balancing the voltages across the capacitors at the end of the separate charging.

6. The circuit of claim 1, wherein said amplifiers are inhibited at least as long as the voltage across the decoupling capacitor is smaller than the reference voltage.

7. The circuit of claim 1, wherein the first and second elements are deactivated when the voltage across the decoupling capacitor reaches said reference voltage.

8. The circuit of claim 1, wherein the first elements comprise a controllable bias circuit having its output connected to a terminal of the coupling capacitor distal from a terminal receiving the input voltage, the bias circuit being connected to a supply terminal of said circuit.

9. The circuit of claim 1, wherein the second elements comprise a controllable current source, connected between a high supply terminal and the first inputs of said amplifiers.

10. The circuit of claim 1, wherein the power amplifier circuit comprises a first control circuit providing a control signal for controlling at least the first and second elements, which switches when the voltage across the decoupling capacitor reaches the reference voltage.

11. The circuit of claim 10, wherein said control signal is also provided on inhibition terminals of said amplifiers.

12. The circuit of claim 10, wherein a switch connects the output of the first operational amplifier to its second input, the output of a second control circuit controlling the switch to an on state during a predetermined time interval from an interruption of the separate charging.

13. The circuit of claim 12, wherein the second control circuit comprises a timing circuit setting said time interval and receiving as an input said control signal and a logic combination circuit receiving as an input said control signal and an output signal of said timing circuit, the output of the combination circuit forming the output of said second control circuit.

14. A power amplifier comprising:
first and second operational amplifiers having respective first inputs receiving a reference voltage across a decoupling capacitor and respective outputs connected across a load and looped back to respective second inputs, the second input of the first operational amplifier receiving, through a coupling capacitor, an input voltage to be amplified;
a first circuit configured to charge the coupling capacitor in response to a control signal; and
a second circuit configured to charge the decoupling capacitor in response to the control signal.

15. A power amplifier as defined in claim 14, wherein the first and second circuits are configured to separately charge the coupling capacitor and the decoupling capacitor, respectively, upon power-on from an off or standby state.

16. A power amplifier as defined in claim 15, further comprising a third circuit configured to inhibit the first operational amplifier during the separate charging.

17. A power amplifier as defined in claim 16, wherein the third circuit is configured for enabling the first operational amplifier after a predetermined time interval which follows the separate charging.

18. A power amplifier as defined in claim 16, wherein the first operational amplifier is inhibited at least as long as the voltage across the decoupling capacitor is less than the reference voltage.

19. A power amplifier as defined in claim 14, wherein the first circuit is configured to charge the coupling capacitor to a first level set by a predetermined voltage at most equal to the reference voltage and the second circuit is configured to charge the decoupling capacitor to a second level set by the reference voltage.

20. A power amplifier as defined in claim 19, wherein the first and second circuits are deactivated when the voltage across coupling capacitor reaches the reference voltage.

21. A power amplifier as defined in claim 19, wherein the first circuit comprises a controllable bias circuit having its output coupled to a terminal of the coupling capacitor opposite from a terminal receiving the input voltage, the bias circuit being connected to a supply terminal.

22. A power amplifier as defined in claim 19, wherein the second circuit comprises a controllable current source connected between a supply terminal and the first inputs of the first and second operational amplifiers.

23. A power amplifier as defined in claim 19, further comprising a first control circuit configured to provide a control signal for controlling the first and second circuits, which switches when the voltage across the decoupling capacitor reaches the reference voltage.

24. A power amplifier as defined in claim 23, further comprising a switch connecting the output and the second input of the first operational amplifier, wherein the output of a second control circuit controls the switch to an on state during a predetermined time interval after the end of the separate charging.

25. A power amplifier as defined in claim 24, wherein the second control circuit comprises a timing circuit setting said predetermined time interval and receiving as an input said control signal, and a logic circuit receiving as an input said control signal and an output signal of the timing circuit, the output of the logic circuit forming the output of the second control circuit.

26. A method for operating a power amplifier comprising first and second operational amplifiers having respective first inputs receiving a reference voltage across a decoupling capacitor and respective outputs connected across a load and looped back to respective second inputs, the second input of the first amplifier receiving through a coupling capacitor an input voltage to be amplified, said method comprising:
separately charging the coupling and decoupling capacitors upon power-on from an off or standby state; and
inhibiting the first and second operational amplifiers during the separate charging.

27. A method as defined in claim 26, further comprising enabling the first and second operational amplifiers after a predetermined time interval which follows the separate charging.

28. A method as defined in claim 26, wherein separately charging the coupling and decoupling capacitors comprises charging the coupling capacitor to a first level set by a predetermined voltage at most equal to the reference voltage, and charging the decoupling capacitor to a second level set by the reference voltage.

29. A method as defined in claim 28, further comprising deactivating charging of the coupling and decoupling capacitors when the voltage across the decoupling capacitors reach the reference voltage.

* * * * *